United States Patent
Choi

(10) Patent No.: US 11,502,549 B2
(45) Date of Patent: Nov. 15, 2022

(54) SYSTEM FOR TRANSMITTING/RECEIVING WIRELESS POWER AND DISPLAY APPARATUS COMPRISING SAME SYSTEM

(71) Applicant: SAMSUNG ELECTRONICS CO., LTD., Suwon-si (KR)

(72) Inventor: Youngho Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 27 days.

(21) Appl. No.: 16/980,209

(22) PCT Filed: Apr. 9, 2019

(86) PCT No.: PCT/KR2019/004207
§ 371 (c)(1),
(2) Date: Sep. 11, 2020

(87) PCT Pub. No.: WO2019/199020
PCT Pub. Date: Oct. 17, 2019

(65) Prior Publication Data
US 2021/0013744 A1    Jan. 14, 2021

(30) Foreign Application Priority Data
Apr. 10, 2018 (KR) .................. 10-2018-0041607

(51) Int. Cl.
*H02J 50/12* (2016.01)
*H02J 7/00* (2006.01)
(Continued)

(52) U.S. Cl.
CPC ............. *H02J 50/12* (2016.02); *G06F 1/26* (2013.01); *G06F 3/147* (2013.01);
(Continued)

(58) Field of Classification Search
CPC .. H02J 50/12; H02J 50/10; H02J 50/80; H02J 50/40; H02J 7/025; H02J 50/05;
(Continued)

(56) References Cited

U.S. PATENT DOCUMENTS 9,735,836 B2    8/2017  Van Wageningen
9,843,226 B2   12/2017  Lee et al.
(Continued)

FOREIGN PATENT DOCUMENTS

KR    10-2013-0005571 A    1/2013
KR    10-2013-0094949 A    8/2013
(Continued)

OTHER PUBLICATIONS

Kim et al., "Spread Spectrum Technology to Reduce the EMI from the Constant Voltage Source Type Wireless Power Transfer System," International Symposium on Antennas and Propagation (ISAP), Oct. 2011, Total 5 pages.
(Continued)

*Primary Examiner* — Dismery Mercedes
(74) *Attorney, Agent, or Firm* — Sughrue Mion, PLLC

(57) ABSTRACT

Disclosed is a system for transmitting/receiving wireless power, the system includes a wireless power transmitter including an inverter that generates a first current using an input power source, a first resonant circuit to which the first current is applied to transmit a power signal, and a first controller that controls the inverter, and a wireless power receiver including a second resonant circuit that receives the power signal, an impedance varying unit that varies an impedance of the second resonant circuit, and a second controller that controls the impedance varying unit, wherein the first controller controls the inverter to spread a frequency spectrum of the power signal, and the second controller controls the impedance varying unit such that the second
(Continued)

resonant circuit resonates with the power signal generated from the first resonant circuit of the wireless power transmitter. Additional various embodiments recognized through the specification are possible.

13 Claims, 6 Drawing Sheets

(51) Int. Cl.
  *H02J 50/80* (2016.01)
  *H02J 13/00* (2006.01)
  *G06F 3/147* (2006.01)
  *H03H 7/38* (2006.01)
  *H02J 50/70* (2016.01)
  *G06F 1/26* (2006.01)

(52) U.S. Cl.
  CPC .......... *H02J 7/00034* (2020.01); *H02J 50/80* (2016.02); *H03H 7/38* (2013.01)

(58) Field of Classification Search
  CPC ........ H02J 50/70; H02J 7/00034; H02J 5/005; H02J 2310/22; H03H 7/40; H03H 7/38; H04B 5/0037; H04B 5/0075; H02M 2310/22; H02M 3/01; H02M 7/4815; H02M 7/05; G06F 1/266; G06F 1/26; G06F 2119/06; G06F 3/147
  See application file for complete search history.

(56) References Cited

U.S. PATENT DOCUMENTS

| | | | |
|---|---|---|---|
| 9,857,821 B2 | 1/2018 | Kurs et al. | |
| 10,243,406 B2 | 3/2019 | Ushijima et al. | |
| 10,263,473 B2* | 4/2019 | DeBaun | G05F 1/66 |
| 10,326,315 B2* | 6/2019 | Bae | H02J 50/70 |
| 10,547,214 B2 | 1/2020 | Ushijima et al. | |
| 2011/0127951 A1* | 6/2011 | Walley | H02J 50/10 |
| | | | 320/108 |
| 2013/0257167 A1* | 10/2013 | Singh | H02J 50/12 |
| | | | 307/104 |
| 2015/0051750 A1 | 2/2015 | Kurs et al. | |
| 2015/0162785 A1* | 6/2015 | Lee | H02J 50/90 |
| | | | 307/104 |
| 2015/0295450 A1* | 10/2015 | Bae | H02J 50/12 |
| | | | 320/108 |
| 2016/0254679 A1* | 9/2016 | Liu | H02J 7/00308 |
| | | | 307/104 |
| 2017/0118722 A1* | 4/2017 | Hong | H02J 50/12 |
| 2017/0222484 A1* | 8/2017 | DeBaun | G05F 1/66 |
| 2018/0101188 A1 | 4/2018 | Kurs et al. | |
| 2018/0351414 A1* | 12/2018 | Park | H02J 50/12 |
| 2018/0375380 A1* | 12/2018 | Liu | H02J 50/12 |
| 2019/0006843 A1* | 1/2019 | Suzuki | H02J 7/045 |
| 2019/0222068 A1 | 7/2019 | Choi et al. | |
| 2020/0287413 A1* | 9/2020 | Peretz | H02J 50/05 |

FOREIGN PATENT DOCUMENTS

| | | |
|---|---|---|
| KR | 10-2015-0023897 A | 3/2015 |
| KR | 10-2015-0032529 A | 3/2015 |
| KR | 10-2017-0007744 A | 1/2017 |
| KR | 10-2018-0009154 A | 1/2018 |

OTHER PUBLICATIONS

Ishida et al., "Magnetic Field Canceling Coil for Wireless Power Transfer System," IEEE, 2015, Total 4 pages.
International Search Report dated Aug. 9, 2019 (PCT/ISA/210) issued by the International Searching Authority for International Application No. PCT/KR2019/004207.
Written Opinion dated Aug. 9, 2019 (PCT/ISA/237) issued by the International Searching Authority for International Application No. PCT/KR2019/004207.
Communication dated Sep. 6, 2022, issued by the Korean Intellectual Property Office in Korean English Patent Application No. 10-2018-0041607.

* cited by examiner

SYSTEM FOR TRANSMITTING/RECEIVING WIRELESS POWER AND DISPLAY APPARATUS COMPRISING SAME SYSTEM

TECHNICAL FIELD

Various embodiments disclosed in the disclosure relate to wireless power transfer techniques.

BACKGROUND ART

Wireless power transfer is a technology that supplies power to home appliances or electric vehicles wirelessly without using a cable. The wireless power transfer technology may include an inductive power transfer system (IPTS) method used for wireless charging such as a smartphone, a coupled magnetic resonance system (CMRS) method used for wireless charging such as an electric vehicle or a high speed railway, or a far-field microwave method used for power generation in space solar power generation.

In recent years, the wireless power transfer technology has been applied to electronic devices that aim for aesthetics or space efficiency. For example, wireless power transfer technology is being applied to display apparatus such as wall-mounted TVs.

DISCLOSURE

Technical Problem

Due to the characteristics of the wireless power transfer, an electromagnetic interference (EMI) signal may be generated in a process of transmitting or receiving a power signal, which may be harmful to a human body or may cause interference with other signals. The EMI signal may be generated, for example, by a leakage magnetic field generated in a coil for transmitting or receiving wireless power. The device to which the wireless power transfer technology is applied may include a separate coil for removing the EMI signal, but in this case, the manufacturing cost or thickness of the device may increase. Alternatively, the EMI signal may be removed by adjusting a frequency of the power signal without adding a separate coil, but in this case, the power transfer efficiency may decrease due to a frequency mismatch.

Various embodiments disclosed in the disclosure may provide a wireless power transmission/reception system and a display apparatus including the same, which may maintain power transmission efficiency while reducing the EMI signal using a spread spectrum.

Technical Solution

In an exemplary embodiment, a wireless power transmission/reception system includes a wireless power transmitter including an inverter that generates a first current using an input power source, a first resonant circuit to which the first current is applied to transmit a power signal, and a first controller that controls the inverter, and a wireless power receiver including a second resonant circuit that receives the power signal, an impedance varying unit that varies an impedance of the second resonant circuit, and a second controller that controls the impedance varying unit, and wherein the first controller controls the inverter to spread a frequency spectrum of the power signal, and the second controller controls the impedance varying unit such that the second resonant circuit resonates with the power signal generated from the first resonant circuit of the wireless power transmitter.

According to an exemplary embodiment, a display apparatus includes a wireless power transmitter including an inverter that generates a first current using an input power source, a first resonant circuit to which the first current is applied to transmit a power signal, and a first controller that controls the inverter, and a wireless power receiver including a second resonant circuit that receives the power signal, an impedance varying unit that varies an impedance of the second resonant circuit, and a second controller that controls the impedance varying unit, and a display connected to the wireless power receiver wiredly to receive power and that displays a specified image by using the received power, and wherein the first controller controls the inverter to spread a frequency spectrum of the power signal, and the second controller controls the impedance varying unit such that the second resonant circuit resonates with the power signal generated from the first resonant circuit of the wireless power transmitter.

Advantageous Effects

According to various embodiments disclosed in the disclosure, a wireless power transmission/reception system may vary a frequency of a power signal within a specified range in a wireless power transmitter, and may vary an impedance of a resonant circuit for receiving the power signal to resonate with the converted frequency of the power signal in a wireless power receiver, thereby supporting a power reception above a specified gain while reducing the EMI signal generated by a leakage magnetic field.

In addition, various effects may be provided that are directly or indirectly identified through this document.

DESCRIPTION OF DRAWINGS

With regard to the description of the drawings, the same or similar reference numerals may be used for the same or similar components.

MODE FOR INVENTION

Figure 1:
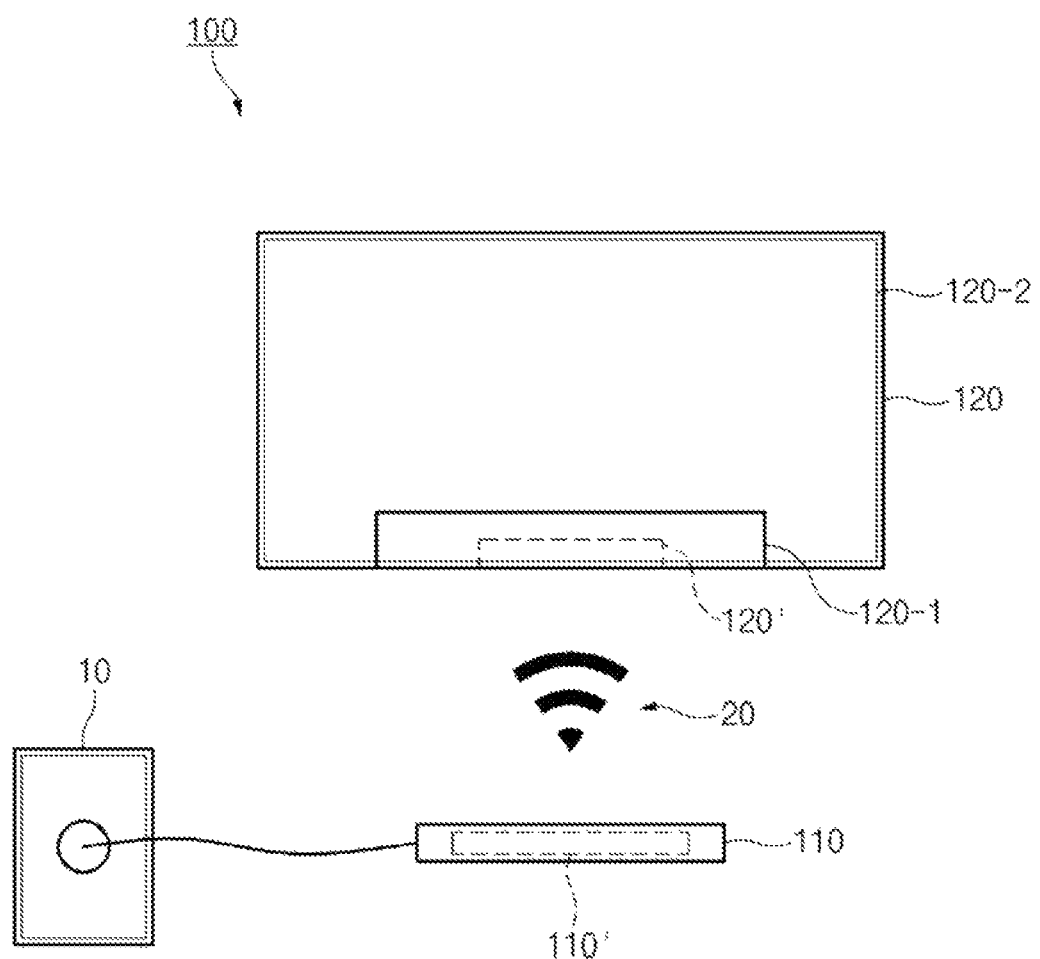
FIG. 1 is a diagram illustrating a display apparatus to which a wireless power transmission/reception system is applied according to various embodiments.

Hereinafter, various embodiments of the disclosure will be described with reference to the accompanying drawings. However, this is not intended to limit the disclosure to the specific embodiments, and it should be understood to include various modifications, equivalents, and/or alternatives of the embodiments of the disclosure. With regard to the description of the drawings, the same or similar reference numerals may be used for the same or similar components.

FIG. 1 is a diagram illustrating a display apparatus to which a wireless power transmission/reception system is applied according to various embodiments.

Referring to FIG. 1, a display apparatus 100 may include a wireless power transmitter 110 and a display 120. In one embodiment, the display 120 may include a wireless power receiver 120-1 for wirelessly receiving power and an image output unit 120-2 for outputting an image, and the wireless power receiver 120-1 and the image output unit 120-2 may be connected wiredly. In other words, the display apparatus 100 may include a wireless power transmission/reception system including the wireless power transmitter 110 and the wireless power receiver 120-1.

According to an embodiment, the wireless power transmitter 110 may be connected to an external power source 10 to receive power. The external power source 10 may include, for example, a wall power source (or commercial power source), and may supply an AC voltage within a specified range (e.g., 85 V to 256 V) to the wireless power transmitter 110.

According to an embodiment, the wireless power transmitter 110 may transmit power supplied from the external power source 10 to the display 120. For example, the wireless power transmitter 110 may transmit a power signal 20 for wirelessly transmitting the power to the display 120. According to an embodiment, the wireless power transmitter 110 may generate the power signal 20 by generating a magnetic field through a first coil 110'. Accordingly, the wireless power transmitter 110 may transmit power supplied from the external power source 10 to the display 120 through the power signal 20.

According to an embodiment, the display 120 may receive power from the wireless power transmitter 110. For example, the display 120 may receive the power signal 20 from the wireless power transmitter 110. According to an embodiment, the display 120 may receive the power signal 20, on the basis of an induced electromotive force generated in a second coil 120' included in the wireless power receiver 120-1 due to the magnetic field generated by the wireless power transmitter 110. According to an embodiment, the display 120 may supply the received power to internal components (e.g., the image output unit 120-2, etc.).

According to an embodiment, the display 120 may output content using the received power. The content may include, for example, at least one of image information and sound information. The content may be stored inside the display apparatus 100 or may be received from an external device (e.g., a set-top box and/or a DVD player). According to an embodiment, the display apparatus 100 may output sound included in the content through a speaker (not illustrated) included in the display 120 or an external speaker device (not illustrated) connected thereto.

According to various embodiments, an electromagnetic interference (EMI) signal may be generated when the display apparatus 100 transmits or receives the power signal 20, which may be harmful to a human body or may cause interference with other devices. The EMI signal may be generated, for example, by a leakage magnetic field that is generated in a coil for wirelessly transmitting or receiving power. Although the display apparatus 100 may include a separate coil for removing the EMI signal, in this case, the manufacturing cost or thickness of the display apparatus 100 may increase. Alternatively, the display apparatus 100 may remove the EMI signal by adjusting a frequency of the power signal 20 without adding the additional coil, but in this case, the transmission efficiency of power may be decreased due to a frequency mismatch of the power signal 20. The wireless power transmission/reception system included in the display apparatus 100 according to various embodiments of the disclosure may maintain the power transmission efficiency while reducing the EMI signal using a spread spectrum.

Figure 2:
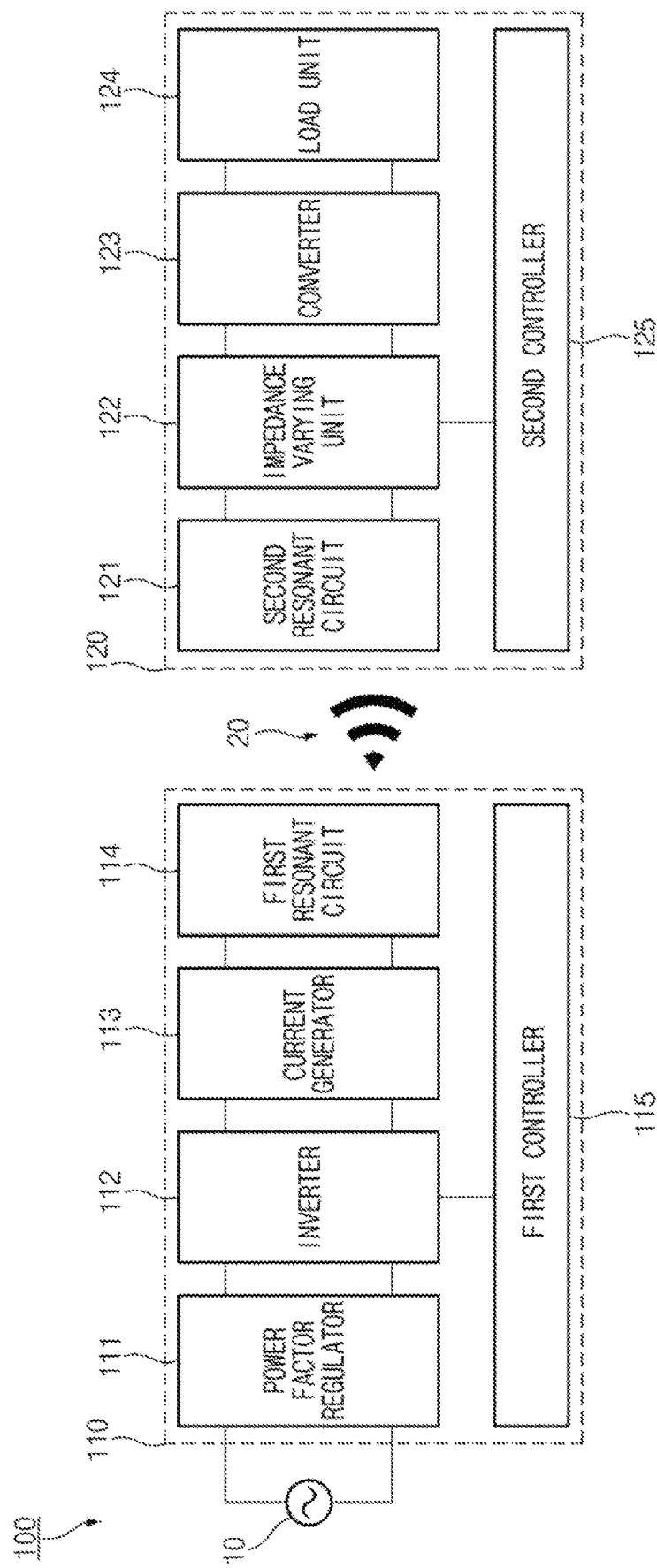
FIG. 2 is a block diagram illustrating a configuration of a display apparatus according to an exemplary embodiment.

FIG. 2 is a block diagram illustrating a configuration of a display apparatus according to an exemplary embodiment.

Referring to FIG. 2, the display apparatus 100 may include a wireless power transmission/reception system for wirelessly transmitting power. The wireless power transmission/reception system may include the wireless power transmitter 110 and some components of the display 120. For example, the wireless power transmission/reception system may include a second resonant circuit 121, an impedance varying unit 122, and a second controller 125 for controlling the impedance varying unit 122, which are included in the display 120, and the wireless power transmitter 110.

According to an embodiment, the wireless power transmitter 110 may include a power factor regulator 111, an inverter 112, a current generator 113, a first resonant circuit 114, and a first controller 115. The wireless power transmitter 110 may receive the AC voltage (or AC current) from the external power source 10.

According to an embodiment, the power factor regulator 111 may output a voltage having a specified magnitude by adjusting a power factor of power supplied from the external power source 10. According to an embodiment, the power factor regulator 111 may output a DC voltage. For example, the power factor regulator 111 may adjust the power factor close to 1 by matching phases between a voltage and a current of a rectified AC voltage, and may output the DC voltage through a capacitor connected to an output terminal.

According to an embodiment, the inverter 112 may convert the DC voltage received from the power factor regulator 111 into the AC voltage. The inverter 112 may include a PWM circuit for a pulse width modulation (PWM). According to an embodiment, the inverter 112 may output a voltage of a frequency (or switching frequency) corresponding to an input control signal. For example, the inverter 112 may turn on or off a switch depending on the input control signal to output a voltage having a frequency corresponding to the control signal.

According to an embodiment, the current generator 113 may output a current having the specified magnitude using the DC voltage input from the power factor regulator 111. The inverter 112 may generate a current (or a first current) supplied to the first resonant circuit 114 through the current generator 113. According to an embodiment, the current generator 113 may output a current having a specified magnitude even though the AC voltage of a different frequency is input from the inverter 112.

According to an embodiment, the first resonant circuit 114 may generate the power signal 20 of a specified frequency (or operating frequency) by using a current of the specified magnitude received from the current generator 113. The specified frequency may be, for example, the same as the frequency (or switching frequency) of the voltage output from the inverter 112. Accordingly, the first resonant circuit 114 may transmit the power signal 20 to the display 120.

According to an embodiment, the first controller 115 may control the overall operation of the wireless power transmitter 110. According to an embodiment, the first controller 115 may control the inverter 112 to vary a frequency (or switching frequency) of the voltage output from the inverter 112. For example, the first controller 115 may vary the frequency (or switching frequency) of the voltage output from the inverter 112, by changing a duty-ratio of a control signal input to the switch included in the inverter 112. In other words, the first controller 115 may control an on-off period of the PWM circuit to determine the frequency of the output voltage.

According to one embodiment, the first controller 115 may vary the frequency of a current having a specified magnitude output through the current generator 113. For example, the first controller 115 may vary the frequency of the current having the specified magnitude output through the current generator 113 by varying the frequency of the voltage output through the inverter 112.

According to an embodiment, the first controller 115 may vary the frequency of the power signal 20 that is transmitted to the display 120 through the first resonant circuit 114. For example, the first controller 115 may vary the frequency of the power signal 20 transmitted to the display 120 through the first resonant circuit 114 by controlling the inverter 112 to vary the frequency of the current having a specified magnitude output through the current generator 113.

According to an embodiment, the first controller 115 may spread a frequency spectrum of the power signal 20 transmitted through the first resonant circuit 114. For example, the first controller 115 may vary the frequency of the power signal 20 within a specified range. The first controller 115 may vary the frequency of the power signal 20 within the specified range, based on a specified frequency (or center frequency). The specified frequency may be, for example, an operating frequency of the first resonant circuit 114. Accordingly, the first controller 115 may perform a spread spectrum function with respect to the power signal 20. According to an embodiment, the first controller 115 may vary the frequency of the power signal 20 at a specified period. The specified period may be determined based on, for example, the operating frequency of the first resonant circuit 114 or a resolution of a spectrum analyzer. Accordingly, when the power signal 20 is transmitted, the wireless power transmitter 110 may decrease the EMI signal that may be generated in the first resonant circuit 114 or the resonant circuit (e.g., the second resonant circuit 121) receiving the power signal 20.

According to one embodiment, the display 120 may include the second resonant circuit 121, the impedance varying unit 122, a converter 123, a load unit 124, and the second controller 125. The wireless power receiver included in the display 120 may include, for example, the second resonant circuit 121, the impedance varying unit 122, and the second controller 125 that controls the impedance varying unit 122.

According to an embodiment, the second resonant circuit 121 may receive the power signal 20 from the wireless power transmitter 110. For example, the second resonant circuit 121 may receive the power signal 20 by resonating at the frequency of the power signal 20. Whether the resonance occurs at the frequency of the power signal 20 may be determined depending on an impedance value of the second resonant circuit 121. According to an embodiment, the second resonant circuit 121 may output power received through the power signal 20 to internal components of the display 120.

According to an embodiment, the impedance varying unit 122 may vary the impedance of the second resonant circuit 121. For example, the impedance varying unit 122 may vary the impedance of the second resonant circuit 121 by varying an effective impedance value of a component (e.g., capacitor) connected to the second resonant circuit 121. According to an embodiment, the impedance varying unit 122 may vary the impedance of the second resonant circuit 121 depending on the input control signal. For example, the impedance varying unit 122 may vary the impedance of the second resonant circuit 121 by turning on or off a switch provided in the rectifying circuit in response to the input control signal to vary the effective impedance value of the component connected to the second resonant circuit 121.

According to an embodiment, the impedance varying unit 122 may convert the AC voltage (or current) received from the second resonant circuit 121 through the rectifying circuit into the DC voltage (or DC current). According to an embodiment, a capacitor (e.g., a smoothing capacitor) for generating the DC voltage may be connected to the output terminal of the impedance varying unit 122.

According to one embodiment, the converter 123 may convert the DC voltage input from the rectifying circuit of the impedance varying unit 122 to match the capacity of the load unit 124. For example, the converter 123 may adjust a level of the DC voltage and may supply the DC voltage having the adjusted level to the load unit 124. According to an embodiment, the converter 123 may output the DC voltage having the specified magnitude.

According to one embodiment, the load unit 124 (or, the image output unit (120-2 of FIG. 1)) may consume power received through the second resonant circuit 121 to perform a specified operation. For example, the load unit 124 may output a specified image using the DC voltage input from the converter 123.

According to one embodiment, the second controller 125 may control an overall operation of the display 120. According to an embodiment, the second controller 125 may control the impedance varying unit 122 to vary the impedance of the second resonant circuit 121. For example, the second controller 125 may vary the impedance of the second resonant circuit 121 by adjusting the on-off period of the switch installed in the rectifying circuit of the impedance varying unit 122 to vary the effective impedance of the component connected to the output terminal of the second resonant circuit 121.

According to an embodiment, the second controller 125 may vary the impedance of the second resonant circuit 121 to resonate with the power signal 20 transmitted from the wireless power transmitter 110. For example, the second controller 125 may vary the impedance of the second resonant circuit 121 to resonate with the magnetic field generated from the first resonant circuit 114 of the wireless power transmitter 110. In other words, the second controller 125 may vary the impedance of the second resonant circuit 121 such that a resonance frequency of the second resonant circuit 121 is the same as the frequency of the power signal 20.

According to an embodiment, the second controller 125 may obtain information on the frequency of the power signal 20 transmitted from the wireless power transmitter 110. For example, the second controller 125 may detect the phase of the power signal 20 received through a phase detector, may detect a point at which a phase becomes 0 (or zero) through the zero crossing detector, and may determine a frequency of the received power signal 20 transmitted less power transmitter. For another example, the second controller 125 may directly receive information on the frequency of the power signal 20 transmitted from the wireless power transmitter 110. According to one embodiment, the second controller 125 may vary the impedance of the second resonant circuit 121 through the impedance varying unit 122 to resonate with the frequency of the power signal 20 depending on the frequency information of the obtained power signal 20. For example, the second controller 125 may vary the impedance of the second resonant circuit 121 to resonate with the power signal 20 whose frequency is variable within the specified range. Accordingly, even though the wireless power transmitter spreads the frequency spectrum by varying the frequency of the power signal 20 to reduce the EMI signal (or even though the spread spectrum function on the power signal 20 is performed), the wireless power receiver in the display 120 resonates with the varied frequency to receive the power signal 20, thereby receiving power above a specified gain.

Figure 3:
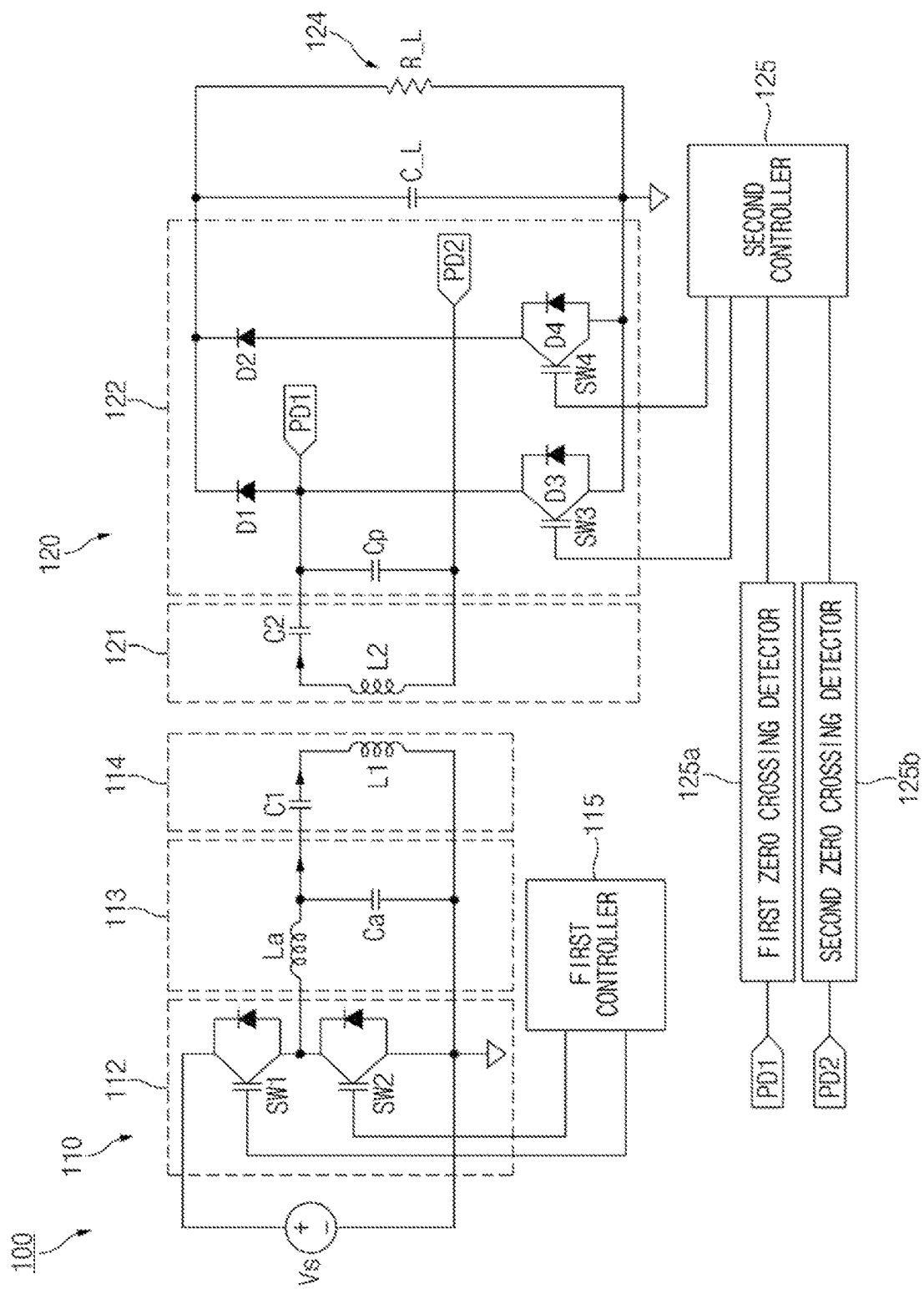
FIG. 3 is a diagram illustrating a circuit of a display apparatus according to an exemplary embodiment.

FIG. 3 is a diagram illustrating a circuit of a display apparatus according to an exemplary embodiment.

Referring to FIG. 3, the wireless power transmitter 110 of the display apparatus 100 may transmit power to the display 120.

According to one embodiment, the DC voltage (Vs) of a specified magnitude may be input to the inverter 112 of the wireless power transmitter 110. The voltage Vs having the specified magnitude may be input from, for example, the power factor regulator (e.g., the power factor regulator 111 of FIG. 2).

According to an embodiment, the inverter 112 may include a first switch sw1 and a second switch sw2, which are connected in series. The first switch sw1 and the second switch sw2 may include, for example, a field effective transistor (FET) switch. According to an embodiment, the inverter 112 may output a voltage at a point between the first switch sw1 and the second switch sw2. According to one embodiment, the first controller 115 may output a voltage (or AC voltage) of the specified frequency (or switching frequency $w_s$) by controlling an on-off period of the first switch sw1 and the second switch sw2.

According to one embodiment, the current generator 113 may include a third resonant circuit. The third resonant circuit may be, for example, a series resonant circuit. A third inductor $L_a$ included in the third resonant circuit may be connected in series with the first resonant circuit 114, and a third capacitor $C_a$ may be connected in parallel with the first resonant circuit 114. In other words, the third inductor $L_a$ may be connected to one end of the input of the first resonant circuit 114, and the third capacitor $C_a$ may be connected to both ends of the input of the first resonant circuit 114. According to an embodiment, the resonance frequency of the third resonant circuit included in the current generator 113 may be the same as an operating frequency (or switching frequency). In other words, values of the third inductor $L_a$ and the third capacitor $C_a$ may be determined such that the resonance frequency of the third resonant circuit is the same as the operating frequency. Accordingly, the current generator 113 may supply a current $i_s$ having a specified magnitude to the first resonant circuit 114.

According to an embodiment, the first resonant circuit 114 may include a first capacitor $C_1$ and a first inductor $L_1$. The first capacitor $C_1$ and the first inductor $L_1$ may be connected, for example, in series. According to an embodiment, a first current $i_1$ may flow through the first resonant circuit 114 by the current $i_s$ of a specified magnitude input from the current generator 113. In other words, the first current $i_1$ may be applied to the first resonant circuit 114. According to an embodiment, the first resonant circuit 114 may output the power signal through the first inductor $L_1$ through which the first current $i_1$ flows. For example, the first resonant circuit 114 may generate the magnetic field that forms a resonance point at a specified frequency (or operating frequency) through the first inductor $L_1$ through which the first current $i_1$ flows.

According to one embodiment, the first controller 115 may spread the frequency spectrum of the power signal transmitted to the display 120 through the first resonant circuit 114. For example, the first controller 115 may control the on-off period of the first switch sw1 and the second switch sw2 in the inverter 112 to vary the frequency of the power signal within the specified range. For another example, the first controller 115 may vary the frequency of the power signal within the specified range, based on the center frequency. Accordingly, the first controller 115 may decrease the EMI signal generated by the leakage magnetic field of the first resonant circuit 114 or the resonant circuit (e.g., the second resonant circuit 121) receiving the power signal.

According to one embodiment, the second resonant circuit 121 in the display 120 may include a second capacitor $C_2$ and a second inductor $L_2$. The second capacitor $C_2$ and the second inductor $L_2$ may be connected, for example, in series. According to an embodiment, the second resonant circuit 121 may receive the power signal transmitted from the wireless power transmitter 110 through the second inductor $L_2$. For example, the second resonant circuit 121 may generate the induced electromotive force by the magnetic field generated by the first resonant circuit 114 of the wireless power transmitter 110. The induced electromotive force may be generated, for example, by the second resonant circuit 121 resonating with the magnetic field generated by the first resonant circuit 114. Accordingly, the second current $i_2$ may flow in the second resonant circuit 121 by the induced electromotive force generated in the second inductor $L_2$.

According to an embodiment, the impedance varying unit 122 may include a fourth capacitor $C_p$ and a rectifying circuit connected to the fourth capacitor $C_p$. The fourth capacitor $C_p$ may be connected, for example, to the second resonant circuit 121 in parallel. In other words, the fourth capacitor $C_p$ may be connected to both ends of the output of the second resonant circuit 121. According to an embodiment, the rectifying circuit may include a bridge circuit including a first diode D1, a second diode D2, a third diode D3, and a fourth diode D4. A third switch sw3 and a fourth switch sw4 for varying the impedance (e.g., capacitance) of the second resonant circuit 121 may be installed to the third diode D3 and the fourth diode D4, respectively. When the third switch sw3 and the fourth switch sw4 are turned off, a current may flow through the third diode D3 and the fourth diode D4. The third switch sw3 and the fourth switch sw4 may include, for example, a FET switch.

According to one embodiment, the second controller 125 may vary an effective capacitance of the fourth capacitor $C_p$ by changing an on-off period of the third switch sw3 and the fourth switch sw4. For example, the second controller 125 may vary the effective capacitance of the fourth capacitor $C_p$ by changing the duty ratio of the control signals input to the third switch sw3 and the fourth switch sw4. The effective capacitance may be derived, for example, by Equation 1 below.

$$C_V = \frac{C_P}{\left(1 - 2*D - \left(\frac{1}{\pi}\right)*\sin(2\pi*D)\right)} \quad \text{[Equation 1]}$$

Where, $C_v$ is an effective capacitance, $C_p$ is a capacitance of the fourth capacitor $C_p$, and D may be a duty ratio of the control signal input to the fourth capacitor $C_p$. As $C_p$ is 1 nF and D is changed between 0 to 20%, $C_v$ may be varied between 1 to 3.36 nF. Accordingly, the second controller 125 may change the impedance of the second resonant circuit 121 using only one capacitor of the impedance varying unit 122.

According to one embodiment, the second controller 125 may vary the impedance of the second resonant circuit 121 to resonate with the power signal transmitted from the wireless power transmitter 110. For example, the second controller 125 may change the duty ratio of the control signals input to the third switch sw3 and the fourth switch sw4 of the impedance varying unit 122 and may vary the impedance of the second resonant circuit 121 to resonate with the power signal transmitted from the wireless power transmitter 110. In other words, the second controller 125 may vary the impedance of the second resonant circuit 121 such that the resonance frequency of the second resonant circuit 121 is the same as the frequency of the power signal.

According to one embodiment, the second controller 125 may obtain information on the frequency of the power signal transmitted from the wireless power transmitter 110. According to one embodiment, the second controller 125 may detect the phase of the power signal received through a first phase detector PD1 and a second phase detector PD2 installed to both ends of the output of the second resonant circuit 121. For example, the first phase detector PD1 and the second phase detector PD2 may detect the phase of the received power signal by outputting a signal having the same frequency as the operating frequency of the wireless power transmitter 110. According to one embodiment, the second controller 125 may detect the frequency of the received power signal by obtaining information on a point at which the phase detected by each of the first phase detector PD1 and the second phase detector PD2 through a first zero crossing detector 125a and a second zero crossing detector 125b becomes 0.

According to one embodiment, the second controller 125 may vary the impedance of the second resonant circuit 121 through the impedance varying unit 122 to resonate with the power signal transmitted from the wireless power transmitter 110, based on the obtained information. For example, the second controller 125 may vary the impedance of the second resonant circuit 121 to resonate with a power signal having a variable frequency within a specified range. Accordingly, the wireless power receiver of the display 120 may receive the power signal having a spectrum spread by resonating at the varied frequency.

According to an embodiment, the impedance varying unit 122 may transfer power received through the second resonant circuit 121 to the load unit 124. For example, the impedance varying unit 122 may output a voltage having a specified magnitude to the load unit 124 through a smoothing capacitor C_L. For example, the load unit 124 may have a variable resistance value R_L depending on an output image.

Figure 4:
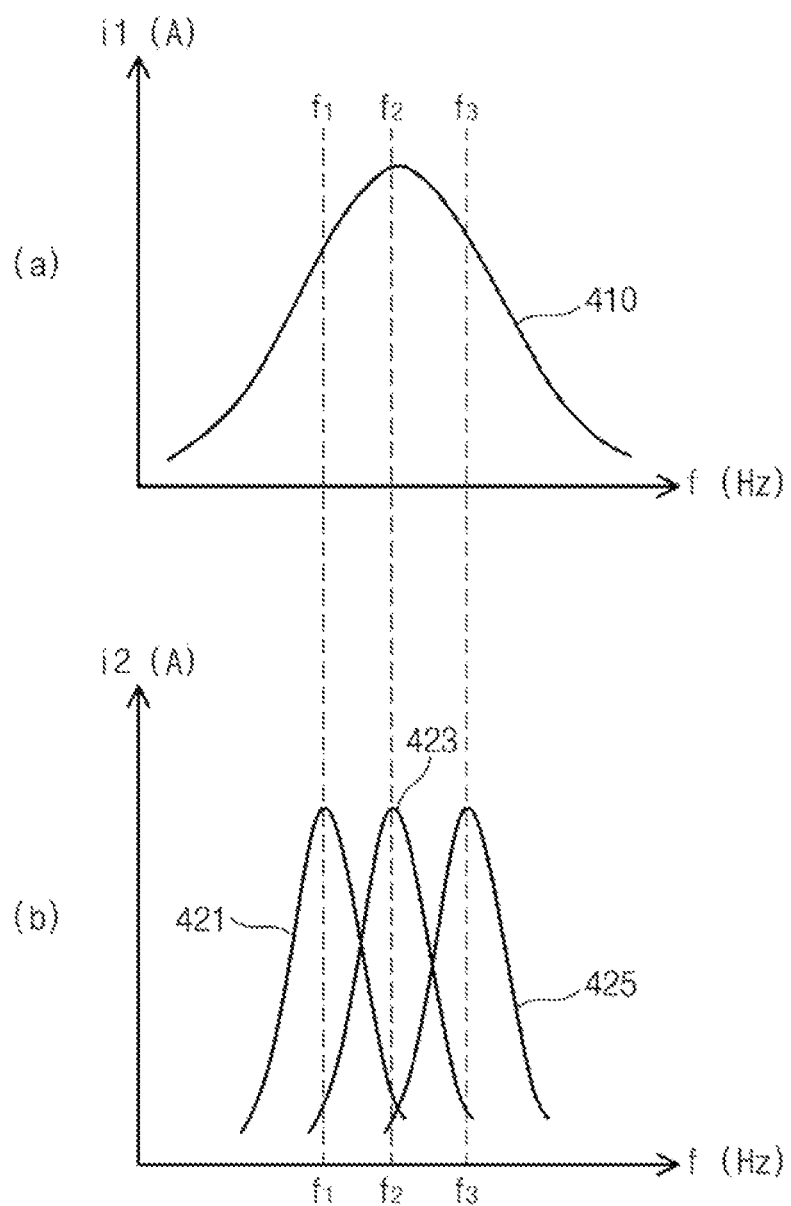
FIG. 4 is a graph illustrating a resonance gain curve of a wireless power transmission/reception system of a display apparatus according to an exemplary embodiment.

FIG. 4 is a graph illustrating a resonance gain curve of a wireless power transmission/reception system of a display apparatus according to an exemplary embodiment.

Referring to FIG. 4, the wireless power receiver (120-1 of FIG. 1) of the display (120 in FIG. 1, 2, or 3) may convert the resonance frequency of the second resonant circuit (121 in FIG. 2 or 3), based on the switching frequency of the wireless power transmitter (110 of FIG. 1). Referring to (a), the wireless power transmitter 110 may vary a frequency 'f' of the power signal within a specified range based on the center frequency. For example, the wireless power transmitter 110 may convert the frequency of the first current $i_1$ flowing to the first resonant circuit (114 of FIG. 2 or 3) through the inverter (112 in FIG. 2 or 3) into a first frequency $f_1$, a second frequency $f_2$, and a third frequency $f_3$, respectively. The second frequency $f_2$ may be, for example, a center frequency. Accordingly, a gain 410 of the first current $i_1$ flowing through the first resonant circuit 114 may be changed. Referring to (b), the wireless power receiver 120-1 of the display 120 may change the resonance frequency 'f' of the second resonant circuit 121 depending on the switching frequency conversion of the wireless power transmitter 110. For example, the wireless power receiver 120-1 may convert the frequency of the second resonant circuit 121 through the impedance varying unit (122 of FIG. 2 or 3) into the first frequency $f_1$, the second frequency $f_2$, and the third frequency $f_3$. Accordingly, the second current $i_2$ having high gains 421, 423, and 425 centered on each of the varied frequencies may flow through the second resonant circuit 121. Accordingly, even though the frequency spectrum of the power signal transmitted by the wireless power transmitter 110 is spread, the wireless power receiver 120-1 may resonate with the transmitted power signal to receive power higher than a specified gain.

Figure 5:
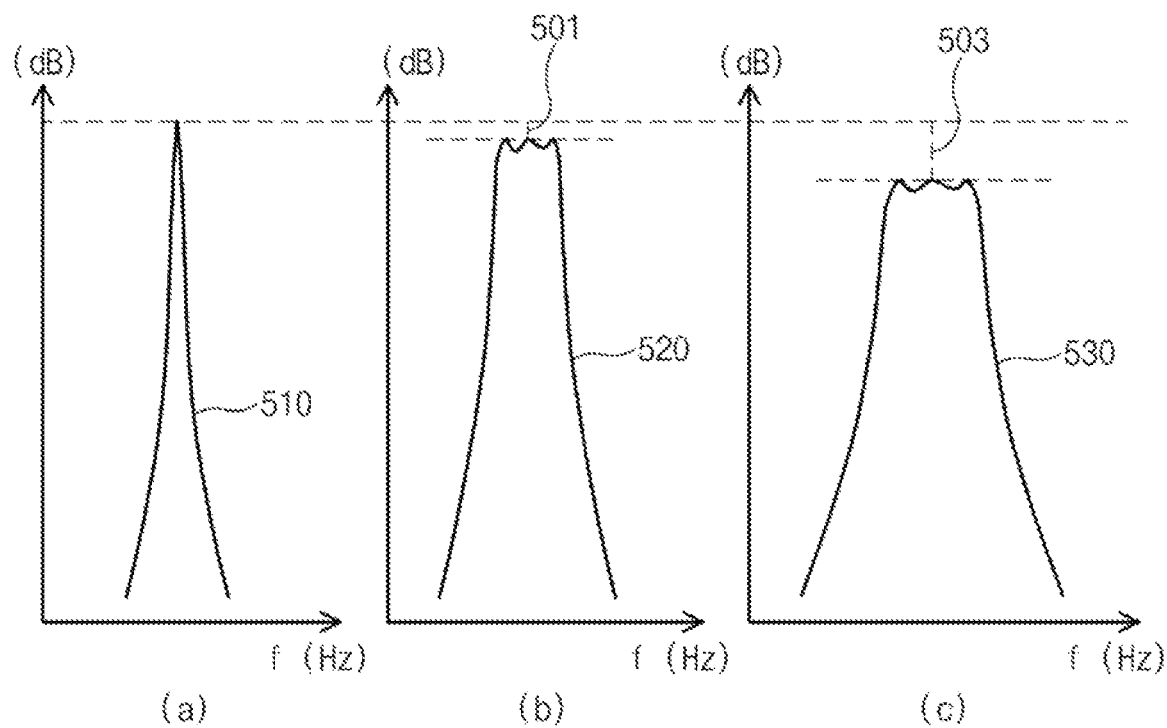
FIG. 5 is a graph illustrating an EMI signal generated in a display apparatus according to an exemplary embodiment.

FIG. 5 is a graph illustrating an EMI signal generated in a display apparatus according to an exemplary embodiment.

Referring to FIG. 5, the display apparatus (100 of FIG. 1, 2, or 3) may decrease a magnitude of the EMI signal by performing the spread spectrum function when the power signal is transmitted. Referring to (a), when the display apparatus 100 does not perform the spread spectrum function, a first EMI signal 510 having a large magnitude at the center frequency may be generated. Referring to (b), the display apparatus 100 may vary the frequency of the power signal within a 1% conversion range, based on the center frequency. In other words, the display apparatus 100 may vary the frequency of the power signal within −1% to 1%, based on the center frequency. A second EMI signal 520 generated in the display apparatus 100 may be reduced in a magnitude 501 compared to the first EMI signal 510 at each converted frequency. Referring to (c), the display apparatus 100 may vary the frequency of the power signal within a 2% conversion range, based on the center frequency. For example, the display apparatus 100 may vary the frequency of the power signal within −2% to 2%, based on the center frequency. A third EMI signal 530 generated in the display apparatus 100 may be decreased in a magnitude 503 compared to the first EMI signal 510 at each converted frequency. In addition, the third EMI signal 530 may be decreased in magnitude compared to the second EMI signal 520 at each converted frequency. Accordingly, the display apparatus 100 may perform the spread spectrum function to receive power greater than or equal to a specified gain as illustrated in FIG. 4, while reducing the magnitude of the EMI signal.

Figure 6:
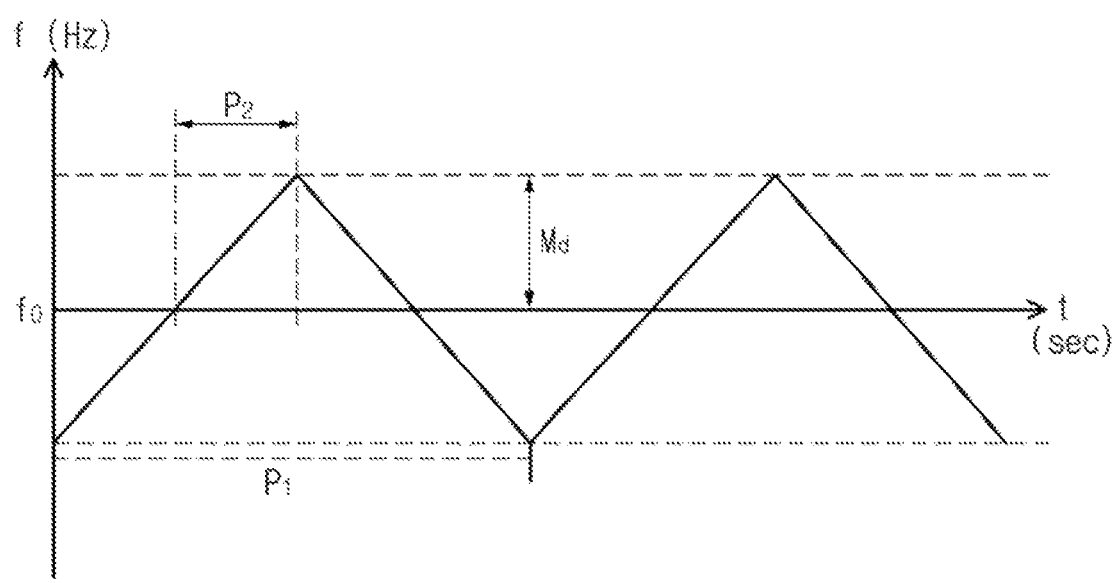
FIG. 6 is a graph illustrating frequency conversion of a power signal by a wireless power transmitter of a display apparatus according to an exemplary embodiment.

FIG. 6 is a graph illustrating frequency conversion of a power signal by a wireless power transmitter of a display apparatus according to an exemplary embodiment.

Referring to FIG. 6, the wireless power transmitter (110 of FIG. 1) of the display apparatus (100 of FIG. 1, 2, or 3) may convert the frequency of the power signal into a first period $P_1$ within the specified range.

According to one embodiment, the wireless power transmitter 110 may convert the frequency of the power signal within the specified range based on the center frequency $f_o$. For example, the wireless power transmitter 110 may vary the frequency from a frequency lower by a specified magnitude $M_d$ than the center frequency $f_o$ to a frequency higher by a specified magnitude $M_d$ than the center frequency $f_o$.

According to one embodiment, the wireless power transmitter 110 may convert the frequency of the power signal into a specified second period $P_2$. According to one embodiment, when the second period $P_2$ corresponding to ¼ of the first period $P_1$ coincides with a resolution of the spectrum analyzer, the effect of reducing the EMI signal may be maximized. For example, when the frequency of the power signal is varied within a 2% conversion range based on the center frequency (or operating frequency) of 85 kHz, and the resolution of the spectrum analyzer is 200 Hz, the magnitude of the EMI signal may be reduced by 12.3 dB.

According to various embodiments of the disclosure described with reference to FIGS. 1 to 6, the wireless power transmission/reception system of the display apparatus 100 may receive power above a specified gain while reducing the EMI signal generated by the leakage magnetic field, by varying a power transmission frequency in a wireless power transmitter within a specified range, and by varying the impedance of the resonant circuit for receiving the power signal in a wireless power receiver to resonate with the converted frequency of the power signal.

A wireless power transmission/reception system according to the above-described various embodiments includes a wireless power transmitter including an inverter that generates a first current using an input power source, a first resonant circuit to which the first current is applied to transmit a power signal, and a first controller that controls the inverter, and a wireless power receiver including a second resonant circuit that receives the power signal, an impedance varying unit that varies an impedance of the second resonant circuit, and a second controller that controls the impedance varying unit.

According to various embodiments, the first controller may control the inverter to spread a frequency spectrum of the power signal.

According to various embodiments, the second controller may control the impedance varying unit such that the second resonant circuit resonates with the power signal generated from the first resonant circuit of the wireless power transmitter.

According to various embodiments, the second controller may convert a resonance frequency of the second resonant circuit to be equal to a frequency of the first current.

According to various embodiments, the impedance varying unit may include a first capacitor connected to an output part of the second resonant circuit, a rectifier circuit connected to the first capacitor, and a first switch and a second switch connected to the rectifier circuit to vary a capacitance of the second resonant circuit.

According to various embodiments, the second controller may control the first switch and the second switch to vary the impedance of the second resonant circuit.

According to various embodiments, the wireless power receiver may further include a phase detector and a zero crossing detector.

According to various embodiments, the second controller may detect a phase of the received power signal through the phase detector, and may detect a point at which a phase detected by the zero crossing detector becomes zero to determine a frequency of the power signal transmitted from the wireless power transmitter.

According to various embodiments, the wireless power transmitter may further include a current generator that generates a current of a specified magnitude.

According to various embodiments, the current generator may include a third resonant circuit.

According to various embodiments, the third resonant circuit may include a second capacitor and a first inductor.

According to various embodiments, the second capacitor may be connected in parallel to the first resonant circuit.

According to various embodiments, the first inductor may be connected in series with the first resonant circuit.

According to various embodiments, the inverter may include a third switch and a fourth switch that convert a frequency of the first current.

According to various embodiments, the first controller may change a period of turning on or off the third switch and the fourth switch to convert the frequency of the first current.

According to various embodiments, the first controller may vary a frequency of the first current within a specified range based on a specified center frequency to expand the frequency spectrum of the power signal.

According to various embodiments, the specified range may correspond to −2% to 2% based on the center frequency.

A display apparatus according to the above-described various embodiments includes a wireless power transmitter including an inverter that generates a first current using an input power source, a first resonant circuit to which the first current is applied to transmit a power signal, and a first controller that controls the inverter, a wireless power receiver including a second resonant circuit that receives the power signal, an impedance varying unit that varies an impedance of the second resonant circuit, and a second controller that controls the impedance varying unit, and a display connected to the wireless power receiver wiredly to receive power and that displays a specified image by using the received power According to various embodiments, the first controller may control the inverter to spread a frequency spectrum of the power signal.

According to various embodiments, the second controller may control the impedance varying unit such that the second resonant circuit resonates with the power signal generated from the first resonant circuit of the wireless power transmitter.

According to various embodiments, the second controller may convert a resonance frequency of the second resonant circuit to be equal to a frequency of the first current.

According to various embodiments, the impedance varying unit may include a first capacitor connected to an output part of the second resonant circuit, a rectifier circuit connected to the first capacitor, and a first switch and a second switch connected to the rectifier circuit to vary a capacitance of the second resonant circuit.

According to various embodiments, the second controller may control the first switch and the second switch to vary the impedance of the second resonant circuit.

According to various embodiments, the wireless power receiver may further include a phase detector and a zero crossing detector.

According to various embodiments, the second controller may detect a phase of the received power signal through the phase detector, and may detect a point at which a phase detected by the zero crossing detector becomes zero to determine a frequency of the power signal transmitted from the wireless power transmitter.

According to various embodiments, the wireless power transmitter may further include a current generator that generates a current of a specified magnitude.

According to various embodiments, the current generator may include a third resonant circuit.

According to various embodiments, the third resonant circuit may include a second capacitor and a first inductor.

According to various embodiments, the second capacitor may be connected in parallel to the first resonant circuit.

According to various embodiments, the first inductor may be connected in series with the first resonant circuit.

According to various embodiments, the inverter may include a third switch and a fourth switch that convert a frequency of the first current.

According to various embodiments, the first controller may change a period of turning on or off the third switch and the fourth switch to convert the frequency of the first current.

According to various embodiments, the first controller may vary a frequency of the first current within a specified range based on a specified center frequency to expand the frequency spectrum of the power signal.

According to various embodiments, the specified range may correspond to −2% to 2% based on the center frequency.

At least a portion of an apparatus (e.g., modules or functions thereof) or a method (e.g., operations) according to various embodiments of the disclosure may be implemented by instructions stored in a computer-readable storage medium in the form of a program module. When the instruction is executed by the processor, the processor may perform a function corresponding to the instruction. Computer-readable recording media include hard disks, floppy disks, magnetic media (e.g., magnetic tape), optical recording media (e.g., CD-ROM, DVD, magnetic-optical media (e.g., a floptical disc), internal memory, etc. Instructions may include code generated by a compiler or code that may be executed by an interpreter.

The embodiments disclosed herein are presented for the purpose of explanation and understanding of the disclosure, and are not intended to limit the scope of the disclosure. Accordingly, the scope of the disclosure should be construed as including all changes or various other embodiments based on the technical spirit of the disclosure.

The invention claimed is:

1. A wireless power transmission/reception system comprising:
   a wireless power transmitter including an inverter configured to generate a first current using an input power source, a first resonant circuit to which the first current is applied to transmit a power signal, and a first controller configured to control the inverter; and
   a wireless power receiver including a second resonant circuit configured to receive the power signal, an impedance varying unit configured to vary an impedance of the second resonant circuit, and a second controller configured to control the impedance varying unit, and
   wherein the first controller is configured to control the inverter to spread a frequency spectrum of the power signal,
   wherein the impedance varying unit includes a first capacitor connected to an output part of the second resonant circuit and a rectifier circuit connected to the first capacitor,
   wherein the rectifier circuit includes a plurality of diodes,
   wherein a first switch is connected to one diode of two diodes among the plurality of diodes and a second switch is connected to the other diode of the two diodes among the plurality of diodes, and
   wherein the second controller is configured to vary the impedance of the second resonant circuit by controlling the first switch and the second switch to resonate with the power signal generated from the first resonant circuit of the wireless power transmitter.

2. The wireless power transmission/reception system of claim 1, wherein the second controller is configured to convert a resonance frequency of the second resonant circuit to be equal to a frequency of the first current.

3. The wireless power transmission/reception system of claim 1, wherein the wireless power receiver further includes a phase detector and a zero crossing detector,
   wherein the second controller is configured to:
   detect a phase of the received power signal through the phase detector, and
   detect a point at which a phase detected by the zero crossing detector becomes zero to determine a frequency of the power signal transmitted from the wireless power transmitter.

4. The wireless power transmission/reception system of claim 1, wherein the wireless power transmitter further includes a current generator configured to generate a current of a specified magnitude, and
   wherein the current generator includes a third resonant circuit.

5. The wireless power transmission/reception system of claim 4, wherein the third resonant circuit includes a second capacitor and a first inductor,
   wherein the second capacitor is connected in parallel to the first resonant circuit, and
   wherein the first inductor is connected in series with the first resonant circuit.

6. The wireless power transmission/reception system of claim 1, wherein the inverter includes a third switch and a fourth switch configured to convert a frequency of the first current, and
   wherein the first controller is configured to change a period of turning on or off the third switch and the fourth switch to convert the frequency of the first current.

7. The wireless power transmission/reception system of claim 1, wherein the first controller is configured to vary a frequency of the first current within a specified range based on a specified center frequency to expand the frequency spectrum of the power signal.

8. A display apparatus comprising:
   a wireless power transmitter including an inverter configured to generate a first current using an input power source, a first resonant circuit to which the first current is applied to transmit a power signal, and a first controller configured to control the inverter; and
   a wireless power receiver including a second resonant circuit configured to receive the power signal, an impedance varying unit configured to vary an impedance of the second resonant circuit, and a second controller configured to control the impedance varying unit; and
   a display connected to the wireless power receiver wiredly to receive power, and configured to display a specified image by using the received power, and
   wherein the first controller is configured to control the inverter to spread a frequency spectrum of the power signal,
   wherein the impedance varying unit includes a first capacitor connected to an output part of the second resonant circuit and a rectifier circuit connected to the first capacitor, wherein the rectifier circuit includes a plurality of diodes,
wherein a first switch is connected to one diode of two diodes among the plurality of diodes and a second switch is connected to the other diode of the two diodes among the plurality of diodes, and
wherein the second controller is configured to vary the impedance of the second resonant circuit by controlling the first switch and the second switch to resonate with the power signal generated from the first resonant circuit of the wireless power transmitter.

9. The display apparatus of claim 8, wherein the second controller is configured to convert a resonance frequency of the second resonant circuit to be equal to a frequency of the first current.

10. The display apparatus of claim 8, wherein the wireless power receiver further includes a phase detector and a zero crossing detector,
wherein the second controller is configured to:
detect a phase of the received power signal through the phase detector, and
detect a point at which a phase detected by the zero crossing detector becomes zero to determine a frequency of the power signal transmitted from the wireless power transmitter.

11. The display apparatus of claim 8, wherein the wireless power transmitter further includes a current generator configured to generate a current of a specified magnitude, and
wherein the current generator includes a third resonant circuit,
wherein the third resonant circuit includes a second capacitor and a first inductor,
wherein the second capacitor is connected in parallel to the first resonant circuit, and
wherein the first inductor is connected in series with the first resonant circuit.

12. The display apparatus of claim 8, wherein the inverter includes a third switch and a fourth switch configured to convert a frequency of the first current, and
wherein the first controller is configured to change a period of turning on or off the third switch and the fourth switch to convert the frequency of the first current.

13. The display apparatus of claim 8, wherein the first controller is configured to vary a frequency of the first current within a specified range based on a specified center frequency to expand the frequency spectrum of the power signal.

* * * * *